United States Patent [19]

Digiovanni

[11] 4,272,730

[45] Jun. 9, 1981

[54] MICROWAVE FREQUENCY SYNTHESIZER UTILIZING A COMBINATION OF A PHASE LOCKED LOOP AND FREQUENCY TRANSLATION TECHNIQUES

[75] Inventor: Joseph J. Digiovanni, Los Altos, Calif.

[73] Assignee: Itek Corporation, Lexington, Mass.

[21] Appl. No.: 34,367

[22] Filed: Apr. 30, 1979

[51] Int. Cl.³ .............................................. H03L 7/18
[52] U.S. Cl. ...................................... 331/16; 331/22; 331/25; 331/31; 331/38
[58] Field of Search .................. 331/16, 18, 22, 25, 331/31, 5-7, 37-41, 76

[56] References Cited

U.S. PATENT DOCUMENTS

| | | | |
|---|---|---|---|
| 3,227,963 | 1/1966 | Dimmick | 331/16 X |
| 3,548,341 | 12/1970 | Berry | 331/76 X |
| 3,588,730 | 6/1971 | Schreuer et al. | 331/22 X |
| 3,588,731 | 6/1971 | Hoeffer et al. | 331/22 X |
| 3,902,132 | 8/1975 | Fried | 331/22 X |
| 3,906,388 | 9/1975 | Jones et al. | 331/39 |
| 4,107,612 | 8/1978 | Leveque | 331/25 X |

*Primary Examiner*—Siegfried H. Grimm
*Attorney, Agent, or Firm*—Limbach, Limbach & Sutton

[57] ABSTRACT

A microwave frequency synthesizer utilizing a phase locked loop for generating a wide range of microwave frequencies in response to a control signal, in combination with a network including a plurality of distinct frequency local oscillators that are appropriately selectable for mixing with the signal output of the phase locked loop for translating it into a desired range, thereby expanding the effective frequency range of the phase locked loop. The combination provides a stable source of microwave frequency signals over a wide frequency range. The combination allows a simple, low cost circuit implementation and may be switched between output frequencies at a very fast speed.

13 Claims, 2 Drawing Figures

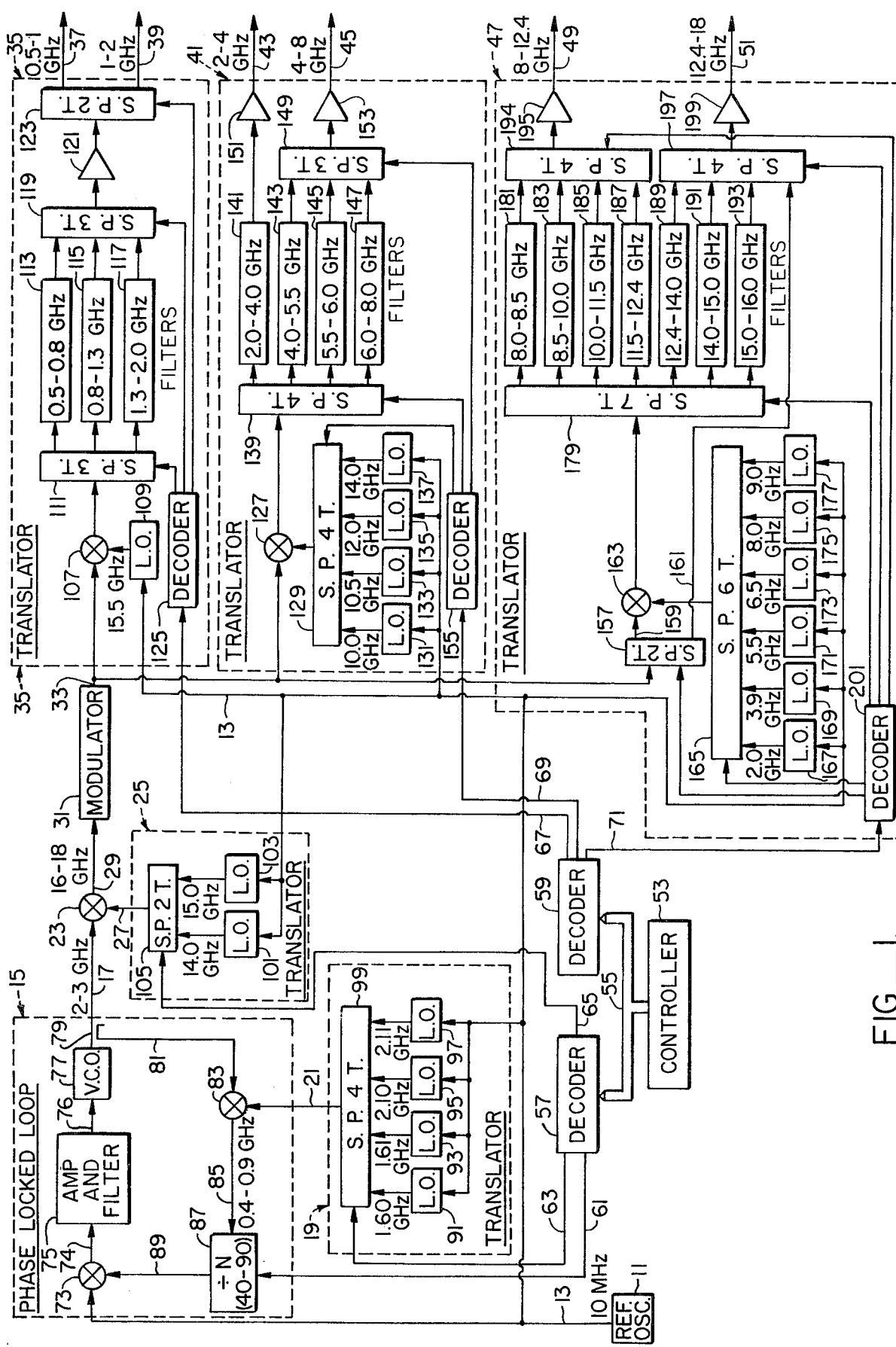
FIG. _1.

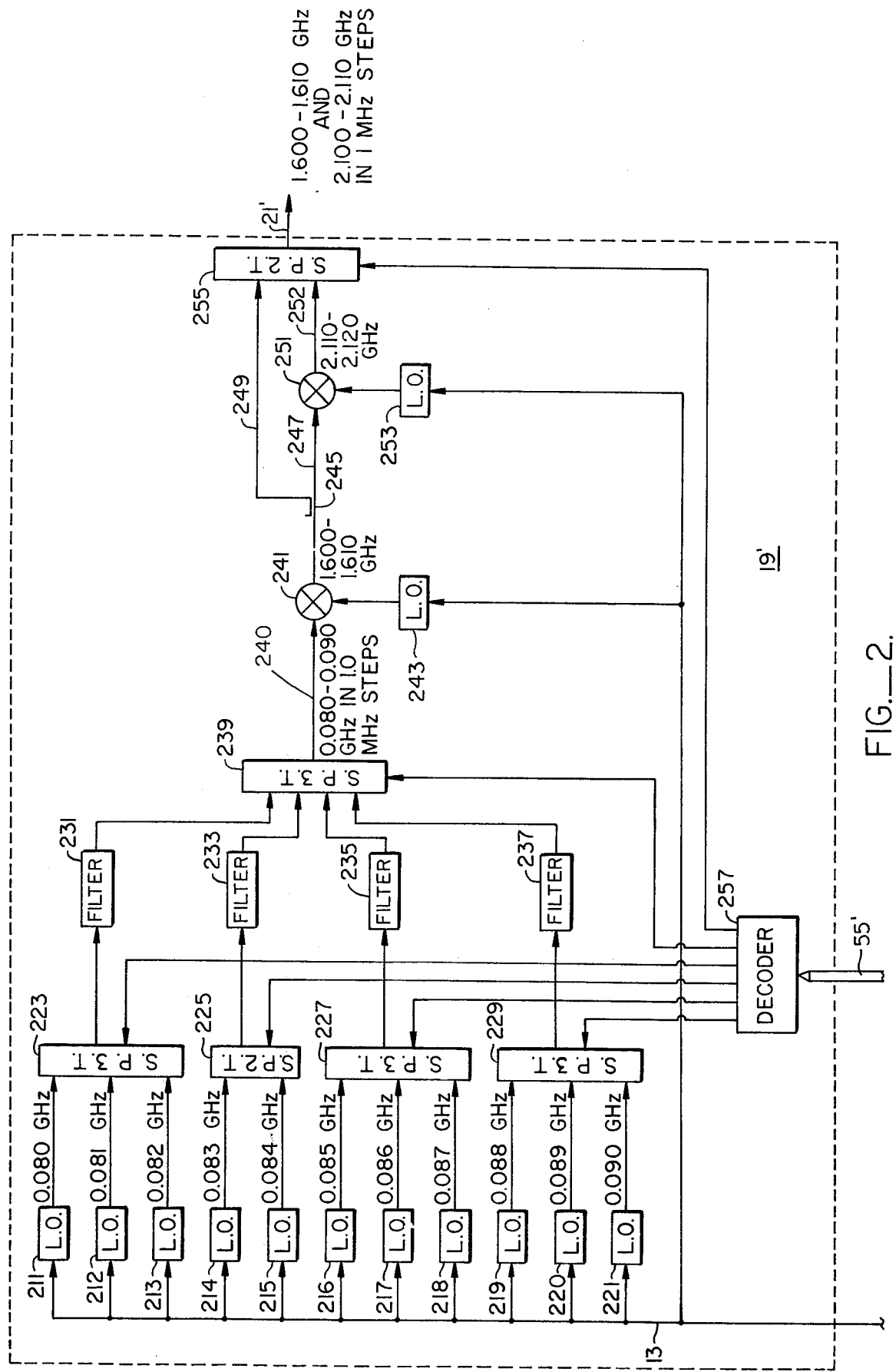
FIG._2.

MICROWAVE FREQUENCY SYNTHESIZER UTILIZING A COMBINATION OF A PHASE LOCKED LOOP AND FREQUENCY TRANSLATION TECHNIQUES

BACKGROUND OF THE INVENTION

This invention relates generally to signal generators, and more particularly to those in the microwave frequency range that are rapidly switchable between specific frequencies for, as an example, simulating a field including numerous distinct frequency radar signals.

A phase locked loop is a commonly used element for a variable frequency signal generator. Frequency output can be changed among discreet frequencies within the output frequency range. The frequency range of a phase locked loop, however, is limited by the range of frequencies which its components can handle. If a signal generator with a wider frequency range is desired, a plurality of phase locked loops may be utilized, each handling a distinct portion of the expanded frequency range, but this is complicated and expensive. Also, phase locked loops of the type presently utilized are slow in changing frequency.

Another technique for a broad frequency band signal generator is to utilize a separate fixed frequency oscillator for each of the discrete frequencies that are desired to be generated within the band. This, of course, involves a great deal of circuit elements and thus is complicated and expensive. For example, if a microwave signal generator has a range of 0.5 GHz to 18.0 GHz by frequency steps of 10 MHz, a total of 130 oscillators at distinct frequencies would be required. Existing techniques suggest that fewer oscillators could be used by selectively combining the oscillators to provide the desired discrete frequency steps but this is also complex and cumbersome if a wide frequency spectrum is desired.

One application of such a signal generator is in the simulation of a radar field that contains a number of different radar signals. Such signal generators are used for training, as an example, of military or other personnel that have a job of detecting and analyzing radar signals. Rather than having separate signal generators for each simulated radar signal, it involves considerably less hardware to utilize one broad band microwave signal source that is rapidly switched between frequencies. After one microwave signal pulse at one particular frequency is emitted then there is a time delay before a second pulse at that frequency needs to be emitted in simulating the radar signal. In this interim, the same oscillator can be used to generate one or more additional microwave pulses at other distinct frequencies to simulate additional radar signals in the field. To do this, however, requires extremely fast switching between frequencies.

Therefore, it is a principal object of the present invention to provide a wide band microwave frequency generator that may be rapidly switched between specific frequencies within its frequency band, is stable in frequency output over time and yet is relatively simple so that the cost and amount and size of hardware can be minimized.

SUMMARY OF THE INVENTION

This and additional objects are accomplished by the present invention wherein, broadly, a phase locked loop is provided for generating microwave signals of a plurality of distinct frequencies within the broadest band width that is possible, coupled with a frequency translation circuit that takes the phase locked loop output and shifts it in frequency by mixing with a fixed frequency output of a selected one of a plurality of different frequency local oscillators. The result is a microwave signal generator having a frequency range that can be several times that of the range of the phase locked loop itself, yet with less complexity in hardware than would be required if only phase locked loops or frequency translation techniques were utilized alone. The frequency stability of a phase locked loop is realized with this combination. Further, a high reference oscillator frequency for the phase locked loop is utilized in order that its frequency may be more rapidly changed than existing phase locked loops, the reference oscillator frequency being in excess of 500 KHz.

In a preferred form of the phase locked loop, in order to permit it to operate over the widest possible frequency range, a frequency translation circuit is provided in its feedback loop ahead of a frequency divider so that the frequency range that needs to be handled by the divider is minimized. The particular circuit can be another phase locked loop or several local oscillators. In a least complicated circuit, a very few local oscillators are utilized for reducing an output signal frequency range of the phase locked loop to a narrower frequency range. For better loop output frequency resolution, according to another aspect of the invention, a larger number of local oscillators (or some other means such as a second phase locked loop) are provided to generate a selected frequency from a larger number of distinct frequency signals that are closer together in frequency. This frequency difference can even be made a small fraction of the frequency of the reference oscillator for the phase locked loop, thereby to combine (1) the advantage of fast frequency switching speed that a phase locked loop has when a high reference oscillator frequency is provided, and (2) the advantage of a large number of closely spaced output signal frequencies upon which the loop can be locked.

Additional objects, advantages and features of the present invention will become apparent from the following description of its preferred embodiments, which should be taken in conjunction with the accompanying drawings.

BRIEF DESCRIPTION OF THE DRAWINGS

FIG. 1 is a block schematic diagram of a microwave signal generator utilizing the various aspects of the present invention; and FIG. 2 is a block schematic diagram of a variation of one sub-system of the microwave signal generator of FIG. 1.

DESCRIPTION OF THE PREFERRED EMBODIMENTS

Referring to FIG. 1, a very specific example of a microwave signal generator according to the present invention is described. The example chosen is for one having an output frequency range of from 0.5 GHz to 18.0 GHz. Specific frequencies within that range are selectable at 10 MHz increments, thus being its resolution. Of course, the various aspects of the present invention are not limited to such a specific generator but rather a complete system is being described in detail in order to better convey the concepts and implementation of the invention.

A reference oscillator 11 generates at an output 13 a very stable 10 MHz reference signal. This reference signal is utilized by a phase locked loop 15 and is also used as a phase reference by every one of the many local oscillators (L.O.) in the system of FIG. 1. The phase locked loop circuit 15 generates at an output line 17 a variable frequency in the range of 2.0–3.0 GHz in increments of 10 MHz. Cooperating with the phase locked loop 15 is a translator circuit 19 that provides by a line 21 to the phase locked loop 15 a frequency shifting signal.

The phase locked loop output in line 17 is made within the range of 2–3 GHz primarily because of limitations of available circuit elements for the phase locked loop 15. It is desired, however, to have the signal within a range of 16.0–18.0 GHz, the top end of the desired output range. It is preferable to start at the top end of the range and translate the frequency downward, rather than the other way around, in order to reduce spurious signals. Therefore, before further use, the output signal in line 17 is shifted to the 16–18 GHz range by a translator circuit 25 which generates in its output line 27 a selected frequency for application to a mixer 23 along with the signal in the line 17. An output 29 of the mixer 23 is thus a signal within the range of 16–18 GHz selectable at 10 MHz increments, as determined by setting of the phase locked loop 15 and the frequency translators 19 and 25. By limiting the output 17 to a 1 GHz frequency range, the quality of the signals and ease of construction of the phase locked loop 15 are maintained. The phase locked loop 15 can change frequency very rapidly because of its high frequency in the reference oscillator line 13 and the wide band width of the amplifier and filter 75.

The signal in the line 29 is a continuous wave signal. For radar simulation work which has been referred to previously, this signal is modulated by a modulator 31 to emit in an output line 33 a series of pulses or bursts of a microwave signal which has been shaped with a modulating amplitude envelope. These are well known techniques and not described further herein. Other applications of a microwave signal generator according to FIG. 1 may leave out the modulator 31 altogether.

The signal in the line 33 is applied simultaneously to three frequency translating circuits 35, 41 and 47. The translator 35 shifts the signal in line 33, that is within a 16–18 GHz range, down to a signal within a 0.5–2.0 GHz range. A line 37 will output the desired signal if within a range of 0.5–1.0 GHz. A line 39 will output the desired signal if within a range of 1.0–2.0 GHz.

Similarly, the translator 41 shifts the signal within the 16–18 GHz range to one within a 2–8 GHz range. A line 43 will output the desired signal if within a range of 2–4 GHz. A line 45 will carry the output signal if within a range of 4–8 GHz.

The third translator 47 shifts the signal within the 16–18 GHz range in line 33 to one within an 8–18 GHz range. A line 49 carries the output signal if within a range of 8.0–12.4 GHz. A line 51 outputs the signal if within a range of 12.4–18.0 GHz.

Thus, the desired frequency is obtained in one of the output lines 37, 39, 43, 45, 49 or 51. Separate output lines are utilized for the specific frequency ranges specified because that is the custom in microwave systems. Each of these lines carries an octave of frequencies. Of course, a single output line carrying the full frequency range of 0.5–18 GHz could be provided if desired for other applications.

In chosing a particular frequency at a given instant to be provided in an appropriate one of the output lines 37–51, a specific setting of a number of switches within the phase locked loop 15 and the translators 19, 25, 35, 41 and 47 need to be made. This is preferably, but not necessarily, accomplished by the use of a central controller 53 that utilizes current microprocessor technology. A digital signal output bus 55 of the controller 53 carries a signal representative of the desired output signal frequency as requested by an operator through a keyboard or other device input to the controller 53. Decoding circuits 57 and 59 respond to that digital signal on the bus 55 to emit proper signals in circuits 61, 63, 65, 67, 69, and 71 which are all connected with the various switching elements, either directly or through further decoding circuits. Of course, any number of other known techniques may be utilized for effecting a proper combination of switch settings in order to generate a desired signal frequency at any instant. An Appendix 'A' to this application is provided to illustrate the various combination of switch settings that are made for some of the output frequencies.

The various particular circuit elements within the circuit blocks of FIG. 1 will now be described in detail. Referring initially to the phase locked loop 15, a phase comparator or mixer 73 has a voltage output in a line 74 that is applied to an amplifier and filter circuit 75. The amplified signal in the line 74 is then applied to an input of a voltage controlled oscillator 77. The oscillator 77 produces an output frequency in the line 17 that is a function of the voltage applied to its input at the line 76. A directional coupler 79 initiates a feedback loop by inserting some of the signal in the line 17 through a line 81 to a mixer 83 whose output in a line 85 is applied to a frequency division circuit 87. An output line 89 of the division circuit 87 is applied at a second input to the mixer 73. When the frequencies and/or phases of the signals in the line 13 and 89 differ, an error voltage is produced whose average value in the line 74 is proportional to that difference. Such a voltage in the line 74 is then applied in the line 76 to the oscillator 77 to change its output frequency in a manner tending to drive the error voltage in the line 74 to zero.

The division circuit 87 divides the frequency in the line 85 by an integer between 40 and 90. That is, the frequency in the output line 89 is reduced from that in the input line 85 by a number between 40 and 90, inclusive. The mixer 83, in conjunction with the translator 19, reduces the frequency in the line 81 to within a window of 0.4 to 0.9 GHz. The division circuit 87 operates best if limited to a 0.5 GHz band width. But since it is desired that the output in the line 17 of the phase locked loop 15 be adjustable over a band width of 1 GHz, a frequency translation is required to reduce the band width of frequencies that are applied to the division circuit 87.

The translator circuit 19, in this specific example, includes four local oscillators 91, 93, 95 and 97. The distinct single frequency outputs of these four oscillators are applied to a single pole, four position switch 99 that is operable through a proper control signal in the line 63 to select one of the oscillator outputs at a time for connection to the line 21. Since the frequency output selected will affect the output frequency in the line 17 from the phase locked loop 15, this selection is coordinated with the other switch positions so that the desired frequency signal is generated in an appropriate one of the output lines 37–51. Each of the local oscillators 91, 93, 95 and 97 is connected to the output 13 of the reference oscillator 11 so that the outputs of these local oscillators will remain in a fixed phase relationship with each other and the reference oscillator 11. In the particular embodiment of FIG. 1, the frequency outputs of oscillators 91 and 93 differ by 10 MHz, incidentally equal to the frequency of the reference oscillator 11, as do the local oscillators 95 and 97. The spread between the outputs of the oscillators 91 and 95 is the 0.5 GHz window of the division circuit 87, as is the difference between oscillators 93 and 97.

The translator 25 serves a function of expanding the frequency range of the signals in the output lines 17 of the phase locked loop 15, as well as translating it to a higher frequency range. Local oscillators 101 and 103 have their distinct single frequency outputs connected to a single pole, two position switch 105 that is controlled by a signal in a line 65. The oscillator that is connected through the switch 105 to the line 27 for mixing with the signal in the line 17 depends upon the output frequency that is called for in the settings of the other switches in the circuit.

The translator 35 includes a mixer 107 which receives the signal in the line 33 and the single frequency signal from a local oscillator 109. A difference between these two input frequencies is applied to a single pole, three position switch 111 which selects connection of the output of the mixer 107 to one of three band pass filters 113, 115 and 117, their bands being indicated on the drawing for the specific system being described. These filters have a purpose of surpressing spurious signals that are the result of the mixing process in the mixer 107. The outputs of these filters are applied to a single pole, three position switch 119 that has a purpose of connecting one of these filter outputs with an amplifier 121. The amplifier 121 is then switched through a switch 123 to either of the output lines 37 or 39. The switches 111, 119 and 123 are controlled through a decoding circuit 125 that operates in response to signals in the circuit 67.

As an example of the operation of the translator 35, consider that a 0.6 GHz output is desired in the line 37. Such a frequency will be developed at the output of the mixer 107 but then it is applied to the switch 111 to the input of the filter 113 that is designed for a frequency band which includes our desired 0.6 GHz signal. The output of the filter 113 is connected through the switch 119 to the amplifier 121 and thence through the switch 123 to the line 37. The single pole switches 119 and 123 are connected as described without being connected to any of the other lines at the same time. If a 1.2 GHz output is desired, that frequency is present at the output of the mixer 107 and it is connected through the switch 111 to the filter 115. The switch 119 is then set to be connected to the output of the filter 115, and the switch 123 is set to connect the output of the amplifier 121 to the output line 39 which has been designated to carry an output of frequencies including this desired frequency.

The translator 41 is constructed in a manner similar to that of the translator 35 except that because it handles a broader frequency range it is somewhat more complicated. A mixer 127 receives the signal from the line 33 and mixes it with a signal output of a single pole four position switch 129 that selects a single distinct frequency output of four local oscillators 131, 133, 135 and 137. The output of the mixer 127 is supplied to a single pole, four position switch 139 that connects that output with one of four band pass filters 141, 143, 145 and 147. The filter 141 handles a full frequency range between 2 and 4 GHz that is desired for the output line 43 so it is applied directly thereto through an amplifier 151. The other three filters 143, 145 and 147 are applied to a single pole, three position switch 149, the output of which is applied through an amplifier 153 to the output line 45. Each of the switches 129, 139 and 149 are positioned in response to control signals from a decoder 155 that in turn operates in response to signals in a circuit 69.

In operation, the translator 41 shifts the frequency in the line 33, through the mixer 127 by one of the local oscillators 131, 133, 135 or 137, to the desired output frequency at the output of the mixer 127. That output is then passed through an appropriate one of the filters 141, 143, 145 or 147 by an appropriate positioning of the switches 139 and 149.

The third translator 47 is even more complicated than the other two because of yet a broader frequency range. A single pole, two position switch 157 is connected to the line 33. The switch 157 connects that line to either of two lines 159 or 161. If connected to the line 159, the signal is passed to a mixer 163 which receives a local oscillator signal from the output of a single pole, six position switch 165. Six local oscillators 167, 169, 171, 173, 175, and 177 are connected to the switch 165. The output of one of these oscillators is connected at one time through the switch 165 to the mixer 163. An output of the mixer 163 is an appropriate difference of the signal frequency in the line 159 and the selected local oscillator output. This signal is applied to a single pole, seven position switch 179 that selects an appropriate one of seven band pass filters 181, 183, 185, 187, 189, 191, and 193. A switch 194 is connected to the outputs of four of these filters, namely 181, 183, 185, and 187. The switch 194 selects one of the outputs for application through an amplifier 195 to the output line 49. A second output switch 197 receives signals from the filters 189, 191, and 193 for application through an amplifier 199 to the output line 51. A fourth position of the switch 197 receives directly the line 161. No frequency shifting is necessary when the desired output signal in the line 51 is in the 16–18 GHz range of the signal in the line 33. Therefore, for that frequency range, the switch 197 is connected to the line 161 directly. Each of the switches 157, 179, 194 and 197 are operated and controlled by control signals from a decoding circuit 201 which in turn receives signals from the circuit 71.

Appendix 'A' attached hereto shows exemplary settings of all switches of the system of FIG. 1 for representative samples of output frequencies in the lines 37–51.

FIG. 2 illustrates a more complicated variation of the frequency translator 19 of FIG. 1 and has been designated as translator 19' since the circuit of FIG. 2 carries out the same general function. An output signal in the line 21' of FIG. 2 replaces the signal in the line 21 of FIG. 1.

The translator 19' of FIG. 2, in a very specific embodiment being described, contains 11 local oscillators 211–221 that each have output frequencies that differ from each other by 0.001 GHz, or expressed as 1 MHz. Each of these local oscillators is referenced to the output 13 of the reference oscillator 11 (FIG. 1). The outputs of the oscillators 211–221 are grouped and applied to respective single pole, multi-throw switches 223, 225, 227 and 229. The outputs of these four switches are applied through their respective filters 231, 233, 235 and 237 to another switch 239. The switch 239 is a single pole, four position switch that presents at an output line 240 a selected one of the outputs of the filters 231–237.

Each of the switches 223, 225, 227, 229 and 239 is controlled from a decoding circuit 257 that receives a changing frequency, but does not sacrifice the available frequency resolution in so doing.

Although the various aspects of the present invention have been described with respect to a specific and detailed electronic system, it will be understood that the invention is entitled to protection within the full scope of the appended claims.

APPENDIX 'A'
SWITCH SETTINGS FOR CERTAIN OUTPUT SIGNAL FREQUENCIES

| Desired Output Frequency | In Output Line | ÷ N | SW 99 | SW 105 | Resulting Line 29 Frequency | Translator 35 SW's/111 & 119 | SW/123 | Translator 41 SW 129 | SW's/139 & 149 |
|---|---|---|---|---|---|---|---|---|---|
| 0.50 GHz | 37 | 40 | L.O. 91 | L.O. 101 | 16 GHz | Filter 113 | Line 37 | — | — |
| 0.51 GHz | 37 | 40 | L.O. 93 | L.O. 101 | 16.01 GHz | Filter 113 | Line 37 | — | — |
| 1.50 GHz | 39 | 40 | L.O. 91 | L.O. 103 | 17.0 GHz | Filter 117 | Line 39 | — | — |
| 1.51 GHz | 39 | 40 | L.O. 93 | L.O. 103 | 17.1 GHz | Filter 117 | Line 39 | — | — |
| 2.70 GHz | 43 | 58 | L.O. 97 | L.O. 101 | 16.7 GHz | — | — | L.O. 137 | Filter 141 |
| 2.71 GHz | 43 | 60 | L.O. 95 | L.O. 101 | 16.71 GHz | — | — | L.O. 137 | Filter 141 |
| 4.10 GHz | 45 | 50 | L.O. 91 | L.O. 101 | 16.10 GHz | — | — | L.O. 135 | Filter 143 |
| 4.11 GHz | 45 | 50 | L.O. 93 | L.O. 101 | 16.11 GHz | — | — | L.O. 135 | Filter 143 |
| 10.0 GHz | 49 | 90 | L.O. 91 | L.O. 101 | 16.5 GHz | — | — | — | — |
| 10.01 GHz | 49 | 40 | L.O. 95 | L.O. 101 | 16.510 GHz | — | — | — | — |
| 13.51 GHz | 51 | 80 | L.O. 93 | L.O. 103 | 17.41 GHz | — | — | — | — |
| 18.0 GHz | 51 | 88 | L.O. 97 | L.O. 103 | 18.0 GHz | — | — | — | — |

| Desired Output Frequency | In Output Line | ÷ N | SW 99 | SW 105 | Resulting Line 29 Frequency | Translator 47 SW 157 | SW 165 | SW's 179, 194 & 197 |
|---|---|---|---|---|---|---|---|---|
| 0.50 GHz | 37 | 40 | L.O. 91 | L.O. 101 | 16 GHz | — | — | — |
| 0.51 GHz | 37 | 40 | L.O. 93 | L.O. 101 | 16.01 GHz | — | — | — |
| 1.50 GHz | 39 | 40 | L.O. 91 | L.O. 103 | 17.0 GHz | — | — | — |
| 1.51 GHz | 39 | 40 | L.O. 93 | L.O. 103 | 17.1 GHz | — | — | — |
| 2.70 GHz | 43 | 58 | L.O. 97 | L.O. 101 | 16.7 GHz | — | — | — |
| 2.71 GHz | 43 | 60 | L.O. 95 | L.O. 101 | 16.71 GHz | — | — | — |
| 4.10 GHz | 45 | 50 | L.O. 91 | L.O. 101 | 16.10 GHz | | | |
| 4.11 GHz | 45 | 50 | L.O. 93 | L.O. 101 | 16.11 GHz | | | |
| 10.0 GHz | 49 | 90 | L.O. 91 | L.O. 101 | 16.5 GHz | Mxer 163 | L.O. 173 | Filter 185 |
| 10.01 GHz | 49 | 40 | L.O. 95 | L.O. 101 | 16.510 GHz | Mxer 163 | L.O. 173 | Filter 185 |
| 13.51 GHz | 51 | 80 | L.O. 93 | L.O. 103 | 17.41 GHz | Mxer 163 | L.O. 169 | Filter 189 |
| 18.0 GHz | 51 | 88 | L.O. 97 | L.O. 103 | 18.0 GHz | SW 197 | None | Line 51 | digital signal on the microprocessor bus 55'. By proper operation of these switches, a single frequency output of one of the oscillators 211–221 is switched to the line 240. This signal is then applied to a mixer 241 where it is combined with an output of a local oscillator 243 to shift its frequency. The mixer output is then connected to a coupler 245 which splits its signal into two paths, one being applied directly through a line 249 to one position of a switch 255, and the other path being in a line 247 to another mixer 251. The mixer 251 also receives the output of a local oscillator 253 for shifting the frequency in the line 247, as appears in a line 252 that is the output of the mixer 251. The line 252 is applied to a second input of the single pole, double position switch 255 which selects between the lines 249 and 252 for connection to its output 21'. The switch 255 is controlled from the decoder 257 and the local oscillators 243 and 253 are synchronized by connection to the reference oscillator output line 13.

The advantage of the circuit 19' of FIG. 2 over the circuit 19 of FIG. 1 is that the resulting resolution of the available frequency steps at the output line 17 (FIG. 1) of the phase locked loop 15 are very small. In the specific example circuit of FIG. 1, these steps are 10 MHz while with the circuit of FIG. 2 utilized these steps are 1 MHz. The circuit of FIG. 2 allows the resolution of the phase locked loop 15 to be a small fraction of the frequency of the reference oscillator 11. This permits a high reference oscillator frequency to be utilized, which allows for fast operation of the phase locked loop 15 in

I claim:

1. A microwave signal generator, comprising:
   an oscillator generating a fixed frequency reference signal, said fixed frequency being in excess of 500 KHz,
   a phase locked loop, comprising:
     a voltage controlled oscillator having an output frequency proportional to a magnitude of an input signal, said oscillator output being that of the phase locked loop and having a given frequency range,
     a feedback loop including a frequency divider that is connected to receive a signal from the output of the voltage controlled oscillator, said frequency divider being responsive to a first control signal for setting an integer by which it divides a frequency of a signal presented to it, and
     a first mixer receiving the reference oscillator output signal and an output of said feedback loop divider, said mixer comparing the phases of said two frequencies and applying to the input of the voltage controlled oscillator an error signal proportional to the relative phases,
   a first frequency translator cooperating with said phase locked loop, comprising:
     a plurality of local oscillators each having a distinct output frequency and being synchronized with the output of said reference oscillator,
     a second mixer in the feedback loop of said phase locked loop receiving the output of the voltage controlled oscillator and with its output connected to the input of said divider, and means responsive to a second control signal for switching one of said local oscillators at a time for connection to said scond mixer whereby said divider receives a signal within a frequency range set by the combination of the local oscillator frequency and the output of the voltage controlled oscillator, and a second frequency translator receiving the output of the voltage controlled oscillator, comprising:

a plurality of local oscillators each having a distinct and fixed output frequency each of which are synchronized with the reference oscillator output signal, a third mixer receiving an output signal from the voltage controlled oscillator, and means responsive to a third control signal for selectively switching one of said local oscillator outputs for connection to said third mixer, whereby the output of said third mixer is a signal having a frequency that is a combination of the selected local oscillators and the frequency to the third mixer from the voltage controlled oscillator, the frequencies of said local oscillators being such that the output signal of said third mixer has a controllable frequency range that is at least several times the given frequency range of the phase locked loop.

2. The microwave signal generator according to claim 1 wherein said first frequency translator is characterized by the output frequencies of the plurality of local oscillators providing frequency increments of less than the frequency of said reference signal oscillator.

3. A microwave signal generator, comprising:
a reference oscillator generating a fixed frequency reference signal in excess of 500 KHz,
a voltage controlled oscillator having an output frequency proportional to a magnitude of an input signal,
a first mixer connected to compare the frequencies of said reference signal and an output signal of a frequency divider circuit, an output signal of said mixer having a magnitude proportional to the relative phase of the signals being compared by said mixer, said output being applied to the input of said voltage controlled oscillator,
a frequency source having an output signal that is controllably switchable among frequencies that differ by a fraction of the fixed reference signal of said reference oscillator, and
a second mixer receiving the output signals of said voltage controlled oscillator and said switchable frequency source for applying a difference or sum of their frequencies to an input of said dividing circuit, whereby a signal generator is provided that is simple, and simultaneously has a fast response time and high frequency resolution.

4. A microwave signal generator, comprising:
a reference oscillator generating a fixed frequency reference signal,
a voltage controlled oscillator having an output frequency proportional to a magnitude of an input signal,
a frequency divider circuit having an output which emits a signal with a frequency that is a given fraction of the frequency of a signal applied to an input within a given maximum bandwidth, said given fraction being set by a first control signal,
a first mixer connected to compare the frequencies of said reference signal and the output signal from said divider circuit, an output signal of said mixer having a magnitude proportional to the relative phase of said signals, said output being applied to the input of said voltage controlled oscillator,
a frequency source having an output signal that is controllably switchable in response to a second control signal within a frequency range substantially equal to said divider circuit input bandwidth, and
a second mixer receiving the output signals of said voltage controlled oscillator and said switchable frequency source for applying a difference or sum of their frequencies to the input of said dividing circuit, whereby a signal generator is provided with a wider frequency range output from said given maximum input bandwidth of said divider circuit.

5. A microwave signal generator, comprising:
means including a phase locked loop for selectively generating an output signal in equal fixed increments in response to a first control signal,
a plurality of local fixed frequency oscillators that each generate a unique frequency output signal,
means responsive to a second control signal for selecting the signal output from one of said plurality of oscillators at a time, and
a mixer connected to simultaneously receive the output signal of said generating means and the output signal of one of the plurality of oscillators as selected by said switching means, said mixer characterized by forming at an output a signal having a frequency related to the relative frequencies of the two signals received by it, the fixed frequencies of said local oscillators being such that the mixer output frequency range is greater than the bandwidth of said phase locked loop,
whereby translation and expansion of the generating means given output frequency range is controllably accomplished by a cooperative selection of said first and second control signals.

6. The microwave signal generator according to claim 5 which additionally comprises a plurality of bandpass filters that have adjacent pass bands covering said mixer output frequency range, and means responsive to third control signal for connecting a selected one of said bandpass filters to receive said mixer output signal, whereby the filter having a bandpass in which the mixer output signal lies is selectable by controlling the relative values of said first, second and third control signals.

7. The microwave signal generator according to claim 5 wherein said phase locked loop is referenced to a fixed frequency oscillator of a frequency substantially greater than said equal fixed increments of the generating means output signal.

8. The microwave signal generator according to claim 7 wherein said phase locked loop includes means within a feedback leg of said loop for shifting its frequency by increments that are a fraction of said reference oscillator frequency.

9. The microwave signal generator according to claim 5 wherein said phase locked loop comprises:

a voltage controlled oscillator having an output signal frequency proportional to a magnitude of an input signal, a first mixer receiving said voltage controlled oscillator output frequency and a translating signal to form at an output a signal having a frequency proportional to a difference therebetween, a frequency divider receiving said first mixer output and dividing its frequency in accordance with a settable integer, said divider being operable over only a given input frequency bandwidth, a second mixer receiving at its inputs a fixed reference signal and the output of said divider circuit, said mixer applying to an input of said voltage controlled oscillator a signal proportional to a difference in phase of its input signals, and means including a plurality of switchable fixed frequency oscillators for generating the translating signal whereby the output signal frequency range of the voltage controlled oscillator may be greater than the operable input frequency bandwidth of said divider.

10. A microwave signal generator, comprising:

a reference oscillator generating a fixed frequency signal in excess of 500 KHz, a voltage controlled oscillator having an output frequency proportional to a magnitude of an input signal, a frequency divider circuit having an output which emits a signal with a frequency that is a given fraction of the frequency of a signal applied to an input within a given maximum bandwidth, said given fraction being set by a first control signal, a first mixer connected to compare the frequencies of said reference signal and the output signal from said divider circuit, an output signal of said mixer having a magnitude proportional to the relative phase of said signals, said output being applied to the input of said voltage controlled oscillator, a frequency source having a single frequency output signal that is controllably switchable in response to a second control signal among frequencies in a first range equal to that of said fixed frequency reference signal, and a second mixer receiving the output signals of said voltage controlled oscillator and said switchable frequency source for applying a difference or sum of their frequencies to the input of said dividing circuit.

11. The microwave signal generator according to claim 10 wherein said frequency source is additionally characterized by its output signal being switchable among a second frequency range substantially equal to said divider circuit input bandwidth, the frequency extreme of said first and second frequency ranges differing substantially by said divider input bandwidth.

12. The microwave signal generator according to either claims 10 or 11 wherein said frequency source is switchable in its frequency range(s) only by an increment substantially equal to the reference oscillator fixed frequency.

13. The microwave signal generator according to either claims 10 or 11 wherein said frequency source is switchable by a plurality of increments in its frequency range(s), the frequency increments being a fraction of the fixed reference signal.

* * * * *